United States Patent [19]

Norman

[11] 4,378,523
[45] Mar. 29, 1983

[54] METERING AND CONTROL SYSTEM

[75] Inventor: Arthur E. Norman, Northridge, Calif.

[73] Assignee: Torr Vacuum Products, Inc., Van Nuys, Calif.

[21] Appl. No.: 193,128

[22] Filed: Oct. 2, 1980

[51] Int. Cl.³ .................... G01R 1/38; G01L 27/00
[52] U.S. Cl. .................................. 324/74; 73/4 V; 324/115
[58] Field of Search ............ 324/115, 74, 130, 157; 73/1 R, 4 R, 4 D, 4 V

[56] References Cited

U.S. PATENT DOCUMENTS 4,125,011 11/1978 Porter .................................. 73/4 R Primary Examiner—Ernest F. Karlsen
Attorney, Agent, or Firm—Keith D. Beecher

[57] ABSTRACT

A metering and control system is provided which in one embodiment provides a continuous reading vacuum gage and a controller for activating relays when the vacuum pressures indicated by the gage pass through one or more set points. The controller comprises solid state electrical control circuitry which is separate from the meter, and which may be switched into the meter circuit for calibration purposes. The control circuitry is made up of individual circuits which may be individually adjusted to selected set points, as indicated on the meter. For this purpose, the meter is selectively switched to the various individual circuits. Then, the meter is switched back to indicate the vacuum pressures encountered in the particular system in which it is installed. As the vacuum pressures pass the various set points, the corresponding relays are activated.

6 Claims, 2 Drawing Figures

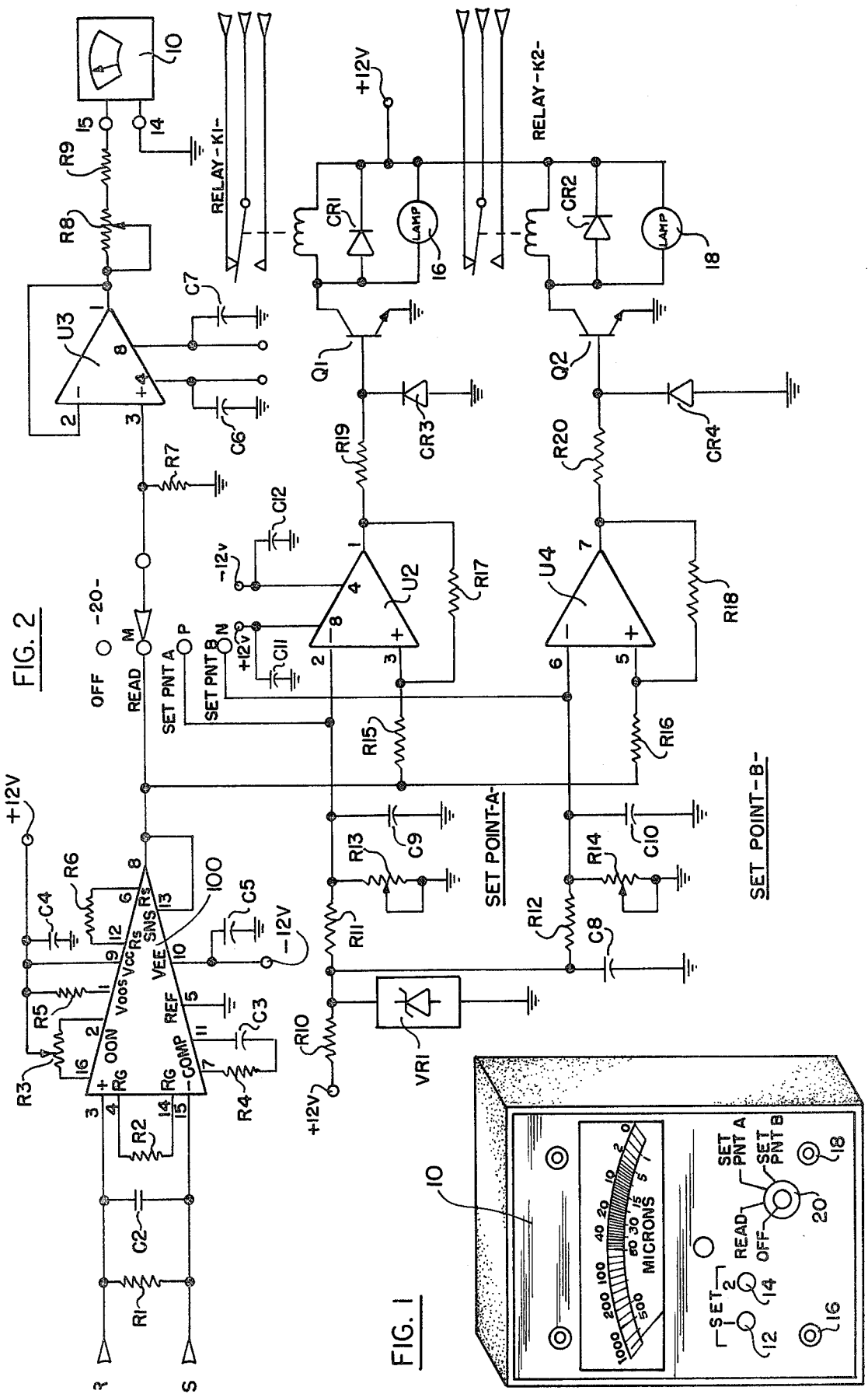

METERING AND CONTROL SYSTEM

BACKGROUND

Although the metering and control system of the present invention has general application, as will be evident as the description proceeds, it finds particular application as a vacuum gage controller.

Present-day vacuum gages use a thermo couple junction which is heated by a separate filament heater, with the heat from the heater passing through the vacuum environment whose pressure is to be measured. Since the thermal conductivity of gases varies significantly with vacuum pressure in the range, for example, of 0.1–1,000 microns, variations in pressure within that range produce significant changes in the temperature of the thermo-couple junction, and significant changes in its voltage output. In accordance with the prior art procedures, an electric meter is connected to the thermo couple which responds to the voltage output of the thermo couple, and which may be calibrated directly in pressure (0.1–1,000 microns) to function as a vacuum pressure gage.

The prior art systems also include controllers coupled to the meter, so that various control effects may be instituted as the meter passes through selected adjustable set points. In such prior art systems, it is usual to provide a relay for each set point, and which is activated when the indicating needle of the meter passes through the particular set point.

The prior art controllers are usually coupled to the meters by mechanical or optical means. However, such prior art controllers are subject to certain drawbacks in that the mechanical means are limited in their accuracy and the optical means are relatively complex and expensive.

The system of the present invention provides a separate solid state control circuit for controlling each relay as the indicating needle of the meter passes through corresponding adjustable set points. The control circuits function independently of the meter during normal operation, and the overall system provides a simple, inexpensive and precise means for activating the relays as the meter passes through the corresponding set points.

As mentioned above, the metering and control system of the invention finds particular, although not exclusive, utility in conjunction with vacuum equipment requiring pressure monitoring, automatic pressure control and/or safety interlocks. Such pressure control may include, for example, the sequencing of valves, the protection and control of diffusion pumps, and/or the actuation of alarm devices and pressure controls.

BRIEF DESCRIPTION OF THE DRAWING

FIG. 1 is a perspective representation of a metering and control system which may be constructed in accordance with the concepts of the present invention; and FIG. 2 is a circuit diagram of solid state circuitry included within the unit of FIG. 1.

DETAILED DESCRIPTION OF THE ILLUSTRATED EMBODIMENT

The unit of FIG. 1 includes a millivolt meter 10 which is controlled by the circuitry of FIG. 2 and which, for example, may be calibrated directly in microns, as indicated.

The unit of FIG. 1 also includes a pair of control knobs for individually controlling potentiometers 12 and 14, the potentiometers being included in separate control circuits, as shown in FIG. 2, and which may be individually adjusted to establish two different set points within the range of the meter 10. It is to be understood that as many control circuits as desired may be incorporated in the controller, each with its own adjusting potentiometer.

The unit also includes an indicating lamp 16 which indicates when the first set point has been reached, and an indicating lamp 18 which indicates when the second set point has been reached.

A control knob for a selector switch 20 is also included on the unit of FIG. 1. The selector switch may be set to "off", "read", "set point A" and "set point B". When the switch is set to read, the meter 10 reads the actual vacuum pressures being monitored. When the switch 20 is set to "set point A" the meter 10 may be used to establish the set point A, by adjusting potentiometer 12. Likewise, when the switch 20 is set to "set point B" the meter 10 may be used to establish set point B, by adjustment of the potentiometer 14.

The circuit of FIG. 2 includes a high gain instrumentation amplifier 100 which may be of the type designated LF352, and which exhibits a gain, for example, of 100. An input voltage is introduced across the positive and negative input terminals of the instrumentation amplifier by way of terminals R and S. This input voltage, for example, may represent pressure readings from a thermo couple junction, as described above. The input terminals are shunted by a 55 ohm resistor R1 and by a 0.01 microfarad capacitor C2. The $R_G$ terminals of the amplifier are shunted by a 1 kilo-ohm resistor R2. The various pins of the instrumentation amplifier are connected as shown. Potentiometer R3 has a value of 10 kilo-ohms, resistor R5 has a value of 5 kilo-ohms, capacitor C4 has a value of 1 microfarad, resistor R6 has a value of 100 kilo-ohms, capacitor C5 has a value of 1 microfarad, capacitor C3 has a value of 0.002 microfarads, and resistor R4 has a value of 160 ohms. The instrumentation amplifier serves to filter out noise and it controls the level of the voltage to be introduced to meter 10.

The output of the instrumentation amplifier 100 is connected to a fixed contact M of selector switch 20, and when the movable contact of the switch contacts fixed contact M, the circuit is in its normal "read" condition. The movable contact M of the switch is connected to the positive input of an operational amplifier U3, and to a 470 kilo-ohm grounded resistor R7. Operational amplifier U3 may be of the type designated LM358, and it is used to drive the meter 10. The output pin of the amplifier is connected back to one of the input pins, and the other pins are connected respectively to a positive 12 volt source and to a negative 12 volt source, and to respective 1 microfarad grounded capacitors C6 and C7. The output of the operational amplifier U3 is connected to one terminal of meter 10 through a 500 ohm variable resistor R8 and through a 680 ohm resistor R9. The other input terminal of meter 10 is grounded.

The control circuit for "set point A" includes a comparator U2, whereas the control circuit for set point B includes a comparator U4. Comparators U2 and U4 may be both contained on the same integrated circuit chip, which may be of the type designated LM358.

The potentiometer 12 included in the first control circuit is designated R13, and may have a value of 1 kilo-ohm. The potentiometer is connected to ground and through a 5.1 kilo-ohm resistor R11 and 1 kilo-ohm resistor R10 to the positive 12 volt voltage source. A grounded regulating Zener diode VR1 is connected to the junction of resistors R11 and R10. This diode may be of the type designated LM329. The junction of potentiometer R13 and resistor R11 is connected to the negative input of comparator U2, and to a 0.01 microfarad capacitor C9.

The potentiometer 14 in the second control circuit is indicated R14, and has a value of 1 kilo-ohm. The potentiometer is connected to ground and through a 5.1 kilo-ohm resistor R12 to the junction of resistors R10 and R11. This junction is also connected to a grounded 1 microfarad capacitor C8. The junction of resistors R12 and R14 is connected to the negative input of comparator U4, and to a grounded 0.01 microfarad capacitor C10.

The negative input of comparator U2 is connected to fixed contact P of selector switch 20, and the negative input of comparator U4 is connected to fixed contact N. The output of the instrumentation amplifier 100 is also connected through respective 1 kilo-ohm resistors R15 and R16 to the positive inputs of comparators U2 and U4.

The pins 4 and 8 of comparator U2 are connected respectively to the negative 12 volt source and to the positive 12 volt source, and to respective 1 microfarad capacitors C12 and C11. The output pin of comparator U2 is connected back to the positive input through a 1.5 megohm resistor R17, and the output pin of comparator U4 is connected back to its positive input through a 1.5 megohm resistor R18.

The output of comparator U2 is connected through a 1 kilo-ohm resistor R19 to the base electrode of an NPN transistor Q1. The transistor may be of the type designated 2N4409. The base electrode is also connected to a grounded diode CR3 which may be of the type designated IN914.

Transistor Q1 is a drive transistor. Its emitter is grounded, and its collector is connected to the positive 12 volt source through the energizing coil of a relay K1. The energizing coil is shunted by a diode CR1, which may be of the type designated IN4002, and by the indicator lamp 16.

Likewise, the output of comparator U4 is connected through a 1 kilo-ohm resistor R20 to the base electrode of a PNP transistor Q2 which also may be of the type designated 2N4009. The base electrode of transistor Q2 is connected to a grounded diode CR4 of the type designated IN914. The emitter of transistor Q2 is grounded, and the collector is connected through the energizing coil of a relay K2. The energizing coil is shunted by a diode CR2 which may be of the type designated IN4002, and by the indicator lamp 18.

Relay K1 may control normally open and normally closed contacts, as indicated, and relay K2 may also control normally closed and normally open contacts. These relays may be used to initiate certain desired control effects, as explained above, as the controller passes its selected set points.

In the operation of the system of FIG. 1, selector switch 20 is first set to its fixed contact P, and potentiometer 12 is adjusted until the needle on meter 10 indicates a pressure corresponding to a desired first set point. Then switch 20 is set to fixed contact N, and the procedure is repeated with potentiometer R14, and potentiometer R14 is adjusted until meter 10 indicates the second set point. As explained above, if additional set points are desired, additional circuits similar to those described above are provided.

Then, selector switch 20 is set to its M contact, and the system operates to indicate vacuum pressures, or other parameters to be measured by the system. When the output from the instrumentation amplifier 10 applied to the positive input of operational amplifier U3 reaches a value corresponding to the first set point, comparator U2 produces an output which activates relay K1, and which causes indicator lamp 16 to be energized.

Likewise, when the output from the amplifier 100 reaches a value corresponding to the second set point, comparator U4 generates an output which activates relay K2, and which causes lamp 18 to be energized.

Both the relays K1 and K2 are energized through a predetermined range of pressures at the respective set points, and this range may be established by appropriate selection of the values of resistors R17 and R18.

As mentioned above, although the metering and control system of the invention has been described in conjunction with vacuum pressures, the system has wider utility, and can be used for the indication of a wide range of parameters.

Therefore, although a particular embodiment of the invention has been shown and described, modifications may be made, and it is intended in the claims to cover all such modifications which fall within the true spirit and scope of the invention.

What is claimed is:

1. A metering and control system including: a meter; a first circuit providing a first output signal varying in a predetermined range and representative of a varying condition; a second circuit coupled to said first circuit for providing a second output signal when the varying condition passes through a predetermined set point, said second circuit including circuitry for providing a reference signal and means for setting said reference signal to a value representative of said predetermined set point; and a selector switch connected to said first circuit and to said reference circuitry for selectively applying said first output signal to said meter to enable said meter to monitor said varying condition, and for selectively applying said reference signal to said meter to enable said meter to indicate that said reference signal is set to a value representative of said predetermined set point.

2. The metering and control system defined in claim 1, in which said meter is a voltmeter, said first output signal is a varying voltage, and in which said reference signal is a voltage set to a particular value.

3. The metering and control system defined in claim 2, in which said control circuitry includes potentiometer means for adjusting the voltage of said reference signal to a selected voltage within the range of the varying voltage of said first output signal, so as to establish said set point to a selected value within the range of said meter.

4. The metering and control system defined in claim 1, and which includes at least one additional circuit coupled to said first circuit for producing at least one additional output signal when the varying condition passes through at least one additional predetermined set point, each of said additional circuits including control circuitry for producing a reference signal representative of said additional set point; and said selector switch selectively applies each of said additional reference signals to said meter.

5. The metering and control system defined in claim 1, in which said second circuit includes a comparator having a first input connected to said first circuit and a variable potentiometer connected to a second input of said comparator for setting said predetermined set point at which said second circuit provides said second output signal.

6. The metering and control system defined in claim 3, in which said second circuit includes a comparator having an input connected to said first circuit, and having a second input connected to said potentiometer.

* * * * *